United States Patent
Kondo et al.

(10) Patent No.: US 6,522,942 B2
(45) Date of Patent: Feb. 18, 2003

(54) TRANSFER APPARATUS FOR SEMICONDUCTOR PROCESS

(75) Inventors: Masaki Kondo, Nirasaki (JP); Hiroaki Saeki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 29 days.

(21) Appl. No.: 09/860,913

(22) Filed: May 21, 2001

(65) Prior Publication Data

US 2002/0002422 A1 Jan. 3, 2002

(30) Foreign Application Priority Data

May 26, 2000 (JP) .................................. 2000-156009

(51) Int. Cl.$^7$ ............................................. G06F 7/00
(52) U.S. Cl. ................. 700/218; 318/568.16; 318/640; 414/936; 414/937; 414/939; 700/258; 700/259; 901/35; 901/39; 901/46
(58) Field of Search ................................. 700/213, 214, 700/218, 258, 259, 254, 253; 414/935, 936, 937, 939; 318/568.16, 640; 901/30, 35, 39, 46, 47

(56) References Cited

U.S. PATENT DOCUMENTS

| 4,944,650 | A | * | 7/1990 | Matsumoto | 294/103.1 |
|---|---|---|---|---|---|
| 4,971,512 | A | * | 11/1990 | Lee et al. | 294/103.1 |
| 5,239,182 | A | * | 8/1993 | Tateyama et al. | 250/559.37 |
| 5,695,562 | A | * | 12/1997 | Mizosaki | 118/669 |
| 5,702,228 | A | * | 12/1997 | Tamai et al. | 294/104 |
| 5,917,601 | A | | 6/1999 | Shimazaki et al. | |
| 5,980,194 | A | | 11/1999 | Freerks et al. | |
| 6,032,083 | A | * | 2/2000 | Oosawa | 700/218 |
| 6,203,617 | B1 | * | 3/2001 | Tanoue et al. | 118/320 |
| 6,298,280 | B1 | * | 10/2001 | Bonora et al. | 414/941 |
| 6,339,730 | B1 | * | 1/2002 | Matsushima | 318/568.16 |

* cited by examiner

Primary Examiner—Khoi H. Tran
(74) Attorney, Agent, or Firm—Oblon, Spivak, McClelland, Maier & Neustadt, P.C.

(57) ABSTRACT

A semiconductor processing system includes a transfer apparatus for transferring a wafer. The transfer apparatus has a pick arm member with wings. The reference distances between the wafer located at the normal position and the wings are stored in a memory of a CPU. Detection ranges of line sensors are set in a standby position in front of a process chamber in order to detect the distances between the wafer and the wings. In the CPU, the amount of positional shift of the wafer is detected based on the reference distances and the detected distances.

19 Claims, 8 Drawing Sheets

TRANSFER APPARATUS FOR SEMICONDUCTOR PROCESS

CROSS-REFERENCE TO RELATED APPLICATIONS

This application is based upon and claims the benefit of priority from the prior Japanese Patent Application No. 2000-156009, filed May 26, 2000, the entire contents of which are incorporated herein by reference.

BACKGROUND OF THE INVENTION

The present invention relates to a transfer apparatus and method for transferring a target substrate to be processed such as a semiconductor wafer in a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

In a process of manufacturing a semiconductor device, a transfer unit is used to transfer a target substrate, such as a semiconductor wafer, between different chambers such as a process chamber and a transfer chamber. A typical transfer unit includes a rotatable and expandable transfer arm having a plurality of arm members rotatably connected to each other. The arm members are constituted of a first arm member, a second arm member, and a pick arm member. The first arm member is rotatably connected to a base of the transfer unit. The second arm member is rotatably connected to the distal end of the first arm member. The pick arm member is rotatably connected to the distal end of the second arm member in order to place a substrate thereon.

When the transfer arm transfers a target substrate, the substrate is not necessarily placed correctly in a normal position on the pick arm member of the transfer arm. Conventionally a method of detecting the amount of positional shift of a target substrate using an optical sensor provided in a given position of a transfer chamber has been known. For example, Jpn. Pat. Appln. KOKAI Publication No. 10-223732 (U.S. Pat. No. 5,917,601) discloses a method of detecting the amount of positional shift of a target substrate when a transfer arm stops in a predetermined position. In this method, an edge of a target substrate on the transfer arm is sensed by an optical sensor and the center of the substrate is obtained from the detected edge.

The above-described conventional method is based on the premise that the transfer arm stops in a predetermined position. More specifically, when the transfer arm stops in the predetermined position, the central position of the substrate stationary on the transfer arm is compared with an ideal central position (normal position) thereof fixed relative to a transfer chamber. Unless the transfer arm stops in the predetermined position, the amount of positional shift of the substrate cannot be detected. In other words, the amount of positional shift cannot be detected in an arbitrary position while the transfer arm is transferring the substrate.

BRIEF SUMMARY OF THE INVENTION

An object of the present invention is to provide an apparatus and a method for transferring a target substrate that are capable of detecting the amount of positional shift of the substrate even when a transfer arm does not stop in a given position.

According to a first aspect of the present invention, there is provided a transfer apparatus for transferring a target substrate in a semiconductor processing system, comprising:
  a transfer member including a mount portion on which the substrate is placed;
  a driving section configured to drive the transfer member in order to transfer the substrate;
  first and second reference portions provided adjacent to the mount portion, the first and second reference portions moving integratedly with the mount portion when the transfer member transfers the substrate;
  a storage section configured to store first and second reference values representing distances between the substrate located at a normal position on the mount portion and the first and second reference portions;
  a detecting section configured to detect first and second distances between the substrate and the first and second reference portions when the transfer member transfers the substrate; and
  a calculating section configured to calculate the amount of positional shift of the substrate from the normal position based on the first and second reference values and the first and second distances.

According to a second aspect of the present invention, there is provided a transfer apparatus for transferring a target substrate in a semiconductor processing system including an airtight process chamber for processing the substrate and an airtight transfer chamber connected to the process chamber through a gate, comprising:
  a transfer member provided in the transfer chamber in order to transfer the substrate between the transfer chamber and the process chamber, the transfer member including a mount portion on which the substrate is placed;
  a driving section configured to drive the transfer member in order to transfer the substrate;
  first and second reference portions which are visible optically and provided adjacent to the mount portion, the first and second reference portions moving integratedly with the mount portion when the transfer member transfers the substrate;
  a storage section configured to store first and second reference values representing distances between the substrate located at a normal position on the mount portion and the first and second reference portions;
  a detecting section for optically detecting first and second distances between the substrate and the first and second reference portions when the transfer member transfers the substrate;
  a calculating section configured to calculate the amount of positional shift of the substrate from the normal position based on the first and second reference values and the first and second distances; and
  a control section configured to control the driving section in consideration of the amount of positional shift of the substrate calculated by the calculating section when the transfer member transfers the substrate to the process chamber.

According to a third aspect of the present invention, there is provided a method of transferring a target substrate in a semiconductor processing system, comprising the steps of:
  preparing a transfer apparatus, wherein the transfer apparatus comprises a transfer member including a mount portion on which the substrate is placed, a driving section configured to drive the transfer member in order to transfer the substrate, and first and second reference portions provided adjacent to the mount portion, the first and second reference portions moving integratedly with the mount portion when the transfer member transfers the substrate;

storing first and second reference values representing distances between the substrate located at a normal position on the mount portion and the first and second reference portions;

detecting first and second distances between the substrate and the first and second reference portions when the transfer member transfers the substrate;

calculating the amount of positional shift of the substrate from the normal position based on the first and second reference values and the first and second distances; and controlling the driving section such that the transfer member transfers the substrate in consideration of the calculated amount of positional shift of the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
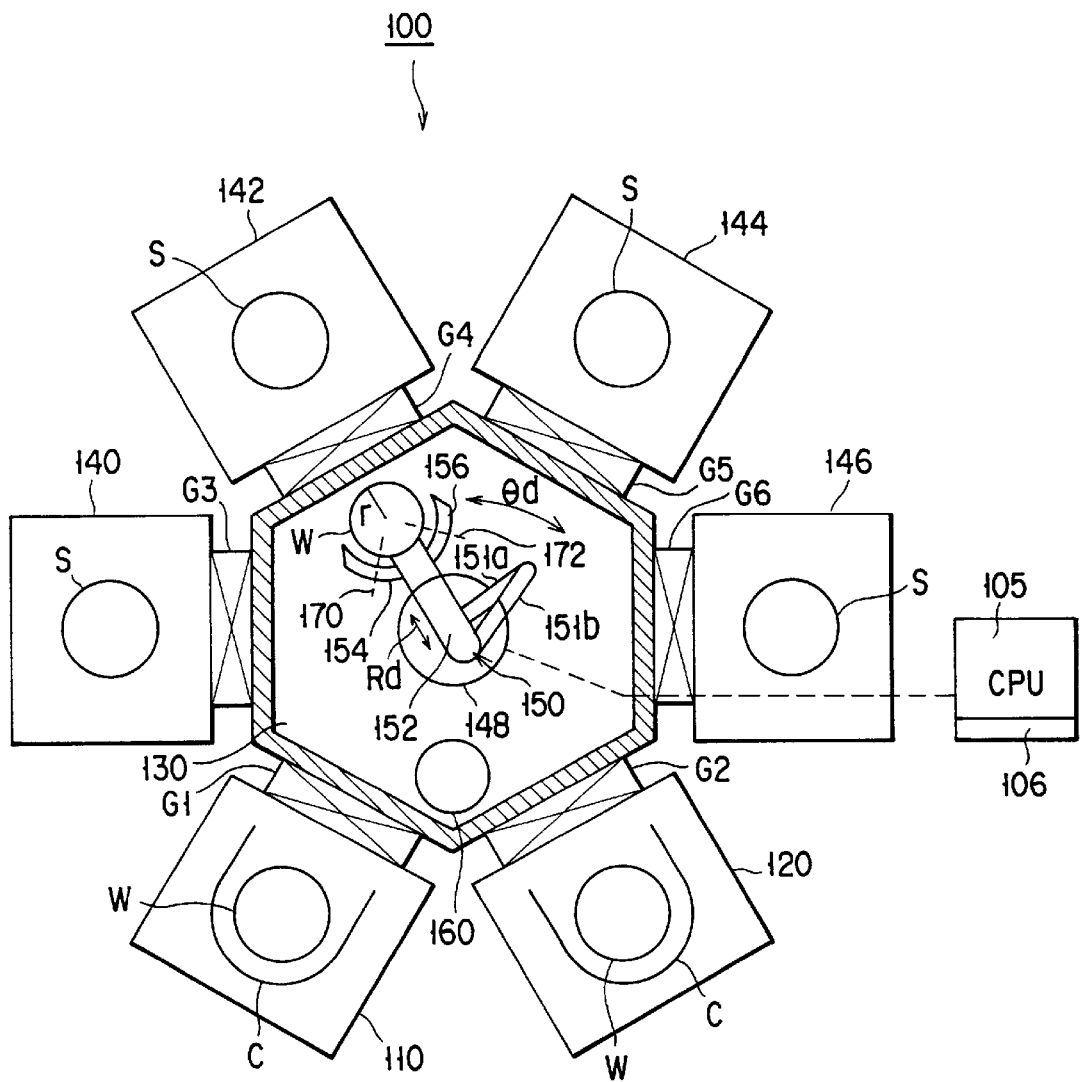
FIG. 1 is a sectional plan view showing a vacuum processing system for performing a semiconductor process that incorporates a transfer apparatus according to an embodiment of the present invention.

Embodiments of the present invention will now be described with reference to the accompanying drawings. The constituting elements having substantially the same functions and structures are denoted by the same reference numerals. Repetitive descriptions of these elements will be given only when the need arises.

(1) Vacuum processing system for performing a semiconductor process:

FIG. 1 is a sectional plan view showing a vacuum processing system 100 for performing a semiconductor process that incorporates a transfer apparatus according to an embodiment of the present invention. The system 100 is so designed as to process a disk-shaped semiconductor wafer of radius r as a target substrate.

As FIG. 1 shows, the vacuum processing system 100 comprises cassette chambers 110 and 120, a common transfer chamber 130, and process chambers 140, 142, 144 and 146. The cassette chambers 110 and 120 are airtightly connected to the common transfer chamber 130 through gate valves G1 and G2. The process chambers 140, 142, 144 and 146 are also airtightly connected to the common transfer chamber 130 through gate valves G3, G4, G5 and G6. These chambers each have an airtight structure to which a gas supply line and a vacuum exhaust line are connected. Pressure can thus be set in the chambers independently of each other.

A cassette C holding a plurality of wafers W is loaded into each of the cassette chambers 110 and 120 from outside the system 100 and unloaded from the cassette chambers. In the process chambers 140, 142, 144 and 146, a wafer W placed on a worktable (susceptor) S is subjected to a predetermined semiconductor process. The common transfer chamber 130 is used to transfer the wafer W among the cassette chambers 110 and 120 and the process chambers 140, 142, 144 and 146. The structure of the vacuum processing system shown in FIG. 1 is only one example. For example, the number of cassette chambers, the number of process chambers, and the arrangement of these chambers can be varied appropriately.

The common transfer chamber 130 includes a transfer arm 150 of the transfer apparatus for holding and transferring the wafers W and an orienter 160 for aligning the wafers W taken out of the cassette chambers 110 and 120. In the transfer chamber 130, a standby position in which the transfer arm 150 stops is set in front of each of the process chambers 140, 142, 144 and 146. A pair of optical sensors, such as optical line sensors 162 and 164 (see FIG. 12), are arranged in accordance with all or some of standby positions in order to detect the amount of positional shift of the wafer transferred by the transfer arm 150. In FIG. 1, broken lines 170 and 172 indicate detection ranges of the line sensors 162 and 164, respectively. FIG. 1 illustrates only the detection ranges 170 and 172 of the standby position in the process chamber 142.

Figure 12:
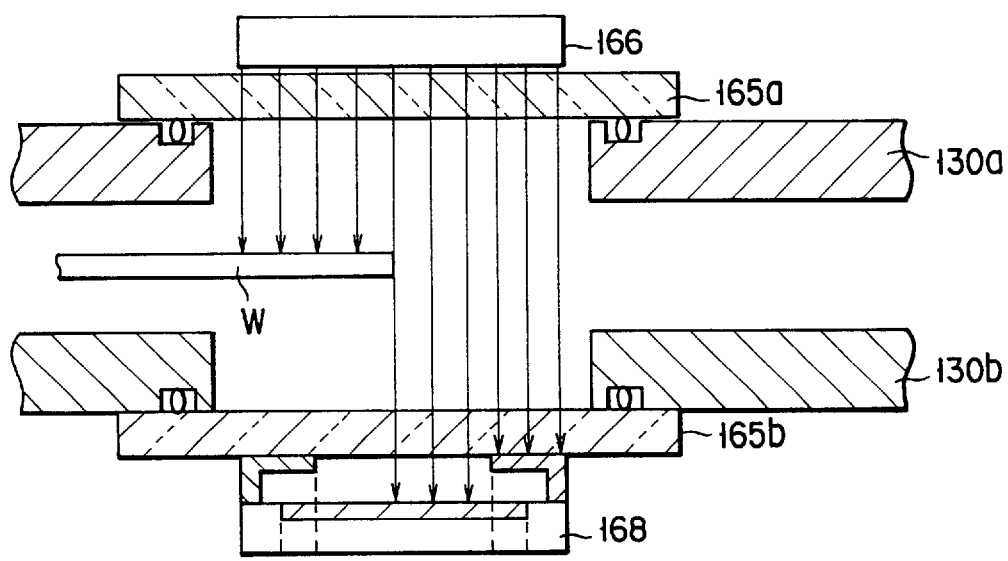
FIG. 12 is a sectional view of the structure of one line sensor in the transfer apparatus illustrated in FIG. 1.

FIG. 12 is a sectional view of the structure of one line sensor in the transfer apparatus shown in FIG. 1. Referring to FIG. 12, upper and lower light-transmitting windows 165*a* and 165*b* are airtightly formed in a ceiling 130*a* and a floor 130*b* of the transfer chamber 130, respectively. A linear light-emitting device 166 is provided opposite to the upper light-transmitting window 165*a*. The length of the device 166 corresponds to that of the detection range 170 or 172. A linear light-receiving device 168 is provided opposite to the lower light-transmitting window 165*b*. The device 168 has the same length as that of the light-emitting device 166 and is aligned with the device 166. A virtually vertical optical band is formed between the devices 166 and 168 in accordance with the detection range 170 or 172. This band extends from the device 166 toward the device 168.

When an object to be detected, such as the wafer W and the transfer arm 150, enters a space between the devices 166 and 168, it blocks the optical band, thereby detecting the amount of light blocked by the object. Where the light-receiving device 168 is of a type with a number of light-receiving elements arranged in line, such as a CCD line sensor, both the amount of light blocked by the object and a position of light blocked by the object, i.e., a position of the object, can be detected. Where the light-receiving device 168 is of a type that measures only the amount of light, only the amount of light blocked by the object can be detected. The light-receiving device 168 can be of either type in the present invention. A CPU 105 controls the light-emitting device 166 and the light-receiving device 168 and processes the signals transmitted from the device 168.

(2) Transfer apparatus:

The transfer apparatus includes a driving section 148 and transfer arm 150. The driving section 148 is airtightly mounted on the bottom of the transfer chamber 130 and controlled by the CPU 105. The transfer arm 150 is provided in the transfer chamber 130 and driven by the driving section 148. The transfer arm 150 has a first arm member 151*a* rotatably connected to the driving section 148, a second arm member 151*b* rotatably connected to the distal end of the first arm member 151*a*, and a pick arm member 152 rotatably connected to the distal end of the second arm member 151*b* to place the wafer W thereon. The first and second arm members 151*a* and 151*b* can be driven in both the expanding/contracting direction (Rd direction in FIG. 1) and the rotating direction ($\theta$d direction in FIG. 1). As will be described later, the CPU 105 causes the driving section 148 to control the operations of the first and second arm members 151*a* and 151*b* so as to compensate for the amount of positional shift of the wafer W between the actual placing position and the normal position based on their positional information.

Figure 2:
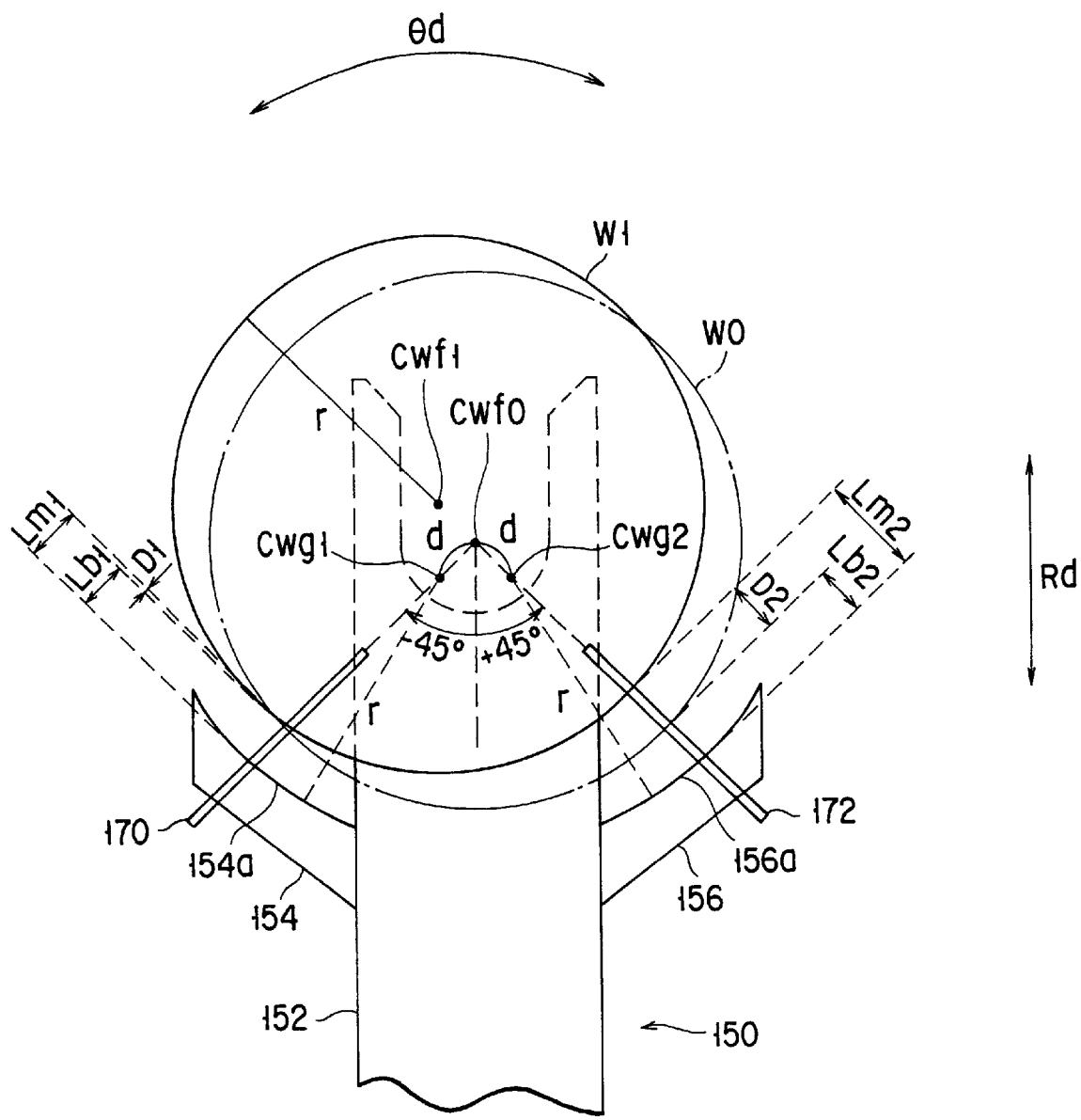
FIG. 2 is a plan view showing a relationship between the distal end portion of a pick arm member, a wafer placed thereon, and the detection ranges of line sensors in the transfer apparatus of FIG. 1.

FIG. 2 is a plan view showing a relationship between a distal end portion of the pick arm member 152, the wafer W placed thereon, and the detection ranges 170 and 172 of the line sensors in the transfer apparatus in FIG. 1. In FIG. 2, alternate long and short dashed lines indicate a wafer $W_0$ placed at the normal position and a symbol $C_{wf0}$ represents the center of the wafer. A solid line indicates a displaced wafer $W_1$ and a symbol $C_{wf1}$ shows the center of the wafer. $\theta$d denotes the rotating direction of the transfer arm and Rd indicates the expanding/contracting direction thereof.

The pick arm member 152 has extending portions (referred to as wings hereinafter) 154 and 156 that extend from both sides thereof. The line sensors measure distances (Lb1, Lb2, Lm1, Lm2) between the edges of the wings and the outer circumference of the wafer W to detect the amount of positional shift of the wafer W. In other words, those portions of the wings 154 and 156 that face the wafer and fall within the detection ranges 170 and 172 correspond to reference portions (reference symbols) for detecting the amount of positional shift of the wafer W.

The edge 154*a* of the wing 154 is shaped like an arc with center $C_{wg1}$ and its radius r is the same as that of the wafer W, while the edge 156*a* of the wing 156 is shaped like an arc with center $C_{wg2}$ and its radius r is the same as that of the wafer W. The centers $C_{wg1}$ and $C_{wg2}$ are located at a distance d from the center $C_{wf0}$ of the wafer $W_0$ placed at the normal position in the directions of $-45°$ and $+45°$ with respect to the expanding/contracting direction (contracting direction) Rd of the transfer arm 150. The edges 154*a* and 156*a* of the wings 154 and 156 coincide with the outer circumference of the wafer $W_0$ when the wafer $W_0$ moves in the detecting direction of the line sensors. Thus, the curvatures of the edges 154*a* and 156*a* of the wings 154 and 156 are equal to that of the outer circumference of the wafer $W_0$.

The above-described distance d will now be discussed. If an allowable amount of positional shift of the wafer W is $d_0$, the distance d needs to have a value that allows the amount of positional shift of at least $d_0$ to be detected. If, however, the distance d is too large, the wings 154 and 156 extending from the transfer arm 150 are lengthened, which inhibits the wafer W from being carried in/out of the process chambers 140, 142, 144 and 146. Consequently, the distance d is set to the maximum potential value of positional shift of the wafer W. If the amount of positional shift falls within the distance d, it can be detected by the use of the apparatus of the present invention. If the diameter of the wafer W is 200 mm, the wings 154 and 156 are formed such that the distance d is set at 10 mm. When the wafer W is displaced from the normal position by 10 mm or more, the processing is stopped or the like.

The solid line indicates the wafer $W_1$ displaced from the normal position. The positional information of the wafer W can be acquired by detecting part of the edges 154*a* and 156*a* that the detection ranges 170 and 172 cross and part of the outer circumference of the wafer W. In other words, the positional information is acquired as distance Lm1 between part of the edge 154*a* of the wing 154 that the detection range 170 crosses and part of the outer circumference of the wafer W and distance Lm2 between part of the edge 156*a* of the wing 156 that the detection range 172 crosses and part of the outer circumference of the wafer W.

In FIG. 2, symbols Lb1 and Lb2 indicate distances (reference values) from the wings 154 and 156 to the wafer $W_0$ located at the normal position, and each of the distances is equal to the above-described distance d. Symbol D1 represents the amount of positional shift of the wafer W in the direction of the detection range 170 and is equal to Lm1-Lb1. Similarly, symbol D2 represents the amount of positional shift of the wafer W in the direction of the detection range 172 and is equal to Lm2-Lb2.

The reference distances Lb1 and Lb2 can be obtained by calculation from design data of the apparatus. The reference distances can also be acquired by means of a so-called teaching, i.e., by actually measuring the wafer W, while placing the wafer W in the normal position of the pick arm member 152 and setting it within the detection ranges of the line sensors. The two values Lb1 and Lb2 are stored in a memory 106 of the CPU 105 and used for calculating the amount of positional shift of the wafer W1 actually transferred based on the above-described distances Lm1 and Lm2.

The detection range 170 of the line sensor 162 extends in the direction of −45° with respect to the expanding/contracting direction (contracting direction) Rd of the transfer arm 150 and crosses the edge of the wing 154 and the outer circumference of the wafer W at the same time. Within the detection range 170, part of the edge and part of the outer circumference are detected to obtain the distance Lm1. Similarly, the detection range 172 of the line sensor 164 extends in the direction of +45° with respect to the expanding/contracting direction (contracting direction) Rd of the transfer arm 150 and crosses the edge of the wing 156 and the outer circumference of the wafer W at the same time. Within the detection range 172, part of the edge and part of the outer circumference are detected to obtain the distance Lm2.

The two detection ranges 170 and 172 perpendicularly cross each other and incline 45° from the expanding/contracting direction Rd of the transfer arm 150. As a result, the sensitivity to a positional shift in the Rd direction and the sensitivity to a positional shift in the θd direction become equal to each other in the R-θ coordinate system (expanding/contracting direction Rd-rotating direction θd), and the amount of positional shift can be detected with high reliability. The sensitivity to a positional shift in the X direction and the sensitivity to a positional shift in the Y direction also become equal to each other even in the X-Y coordinate system. Even though the inclination angle is set at 30° or 60°, the present invention can be attained.

When a CCD line sensor is used, the position of a light-shielding object can be determined from the output of the sensor, so that the distances Lm1 and Lm2 can be obtained by software. When a linear line sensor is used, its output is proportionate to the amount of light transmitted from a light-emitting device to a light-receiving device. When the linear line sensor is employed, the portions other than those corresponding to the distances Lm1 and Lm2 receive light in the structure shown in FIG. 2. The distances Lm1 and Lm2 cannot be measured correctly. Such a problem is solved by the use of the pick arm members shown in FIGS. 8 and 9.

Figure 3:
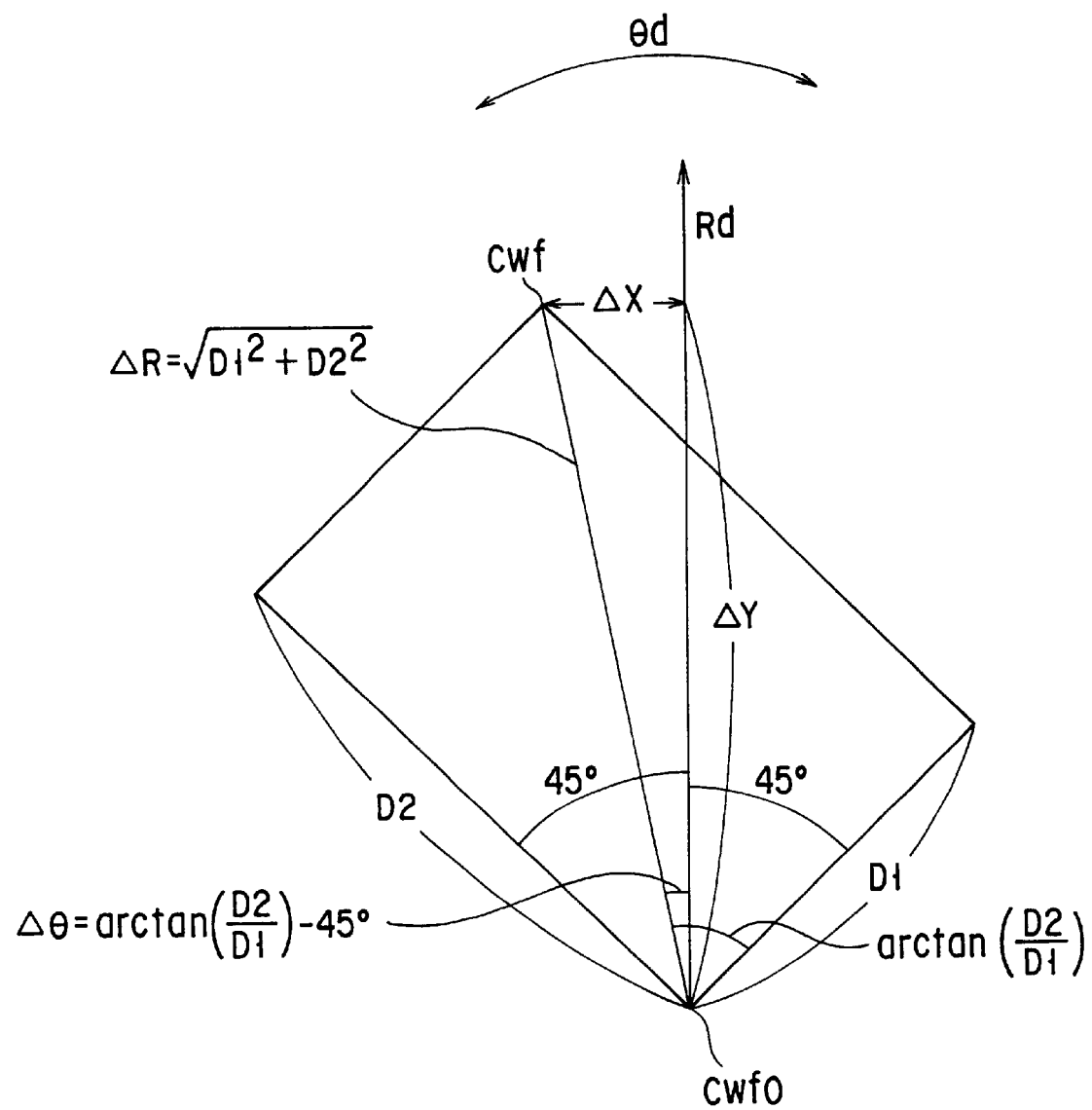
FIG. 3 is a view explaining the amount of positional shift of a wafer in the transfer apparatus shown in FIG. 1.

(3) Method for calculating the amount of positional shift of wafer W:

FIG. 3 is an enlarged view showing the amount of positional shift D1 in the direction of the detection range 170 and the amount of positional shift D2 in the direction of the detection range 172. Assuming that the amount of positional shift in the expanding/contracting direction Rd of the transfer arm is ΔR and the amount of positional shift in the rotating direction θd is Δθ, ΔR and Δθ can be obtained by the following equations:

$$\Delta R = \sqrt{(D1^2 + D2^2)}$$

$$\Delta \theta = \arctan(D2/D1) - 45°$$

Assuming that the amount of positional shift in the X direction of the transfer arm is ΔX and the amount of positional shift in the Y direction is ΔY, ΔX and ΔY can be obtained by the following equations:

$$\Delta X = \sqrt{(D1^2 + D2^2)} \cdot \sin(\arctan(D2/D1) - 45°)$$

$$\Delta Y = \sqrt{(D1^2 + D2^2)} \cdot \cos(\arctan(D2/D1) - 45°)$$

The transfer arm 150, which makes an R-θ movement (expanding/contracting direction Rd-rotating direction θd) shown in FIG. 1, transfers the displaced wafer W to a destination while performing correction for the calculated amounts of positional shift ΔR and Δθ by the known method. When the transfer arm 150 transfers the wafer W from a standby position to the process chamber 142, the CPU 105 considers a calculated amount of positional shift of the wafer W and controls the driving section 148 such that the transfer arm 150 compensates for, i.e., performs correction for, the amount of positional shift. A transfer arm (not shown), which makes an X-Y movement, transfers the displaced wafer W to a destination while correcting the calculated amounts of positional shift ΔX and ΔY. The wafer can thus be transferred to a normal position of the destination.

Figure 4:
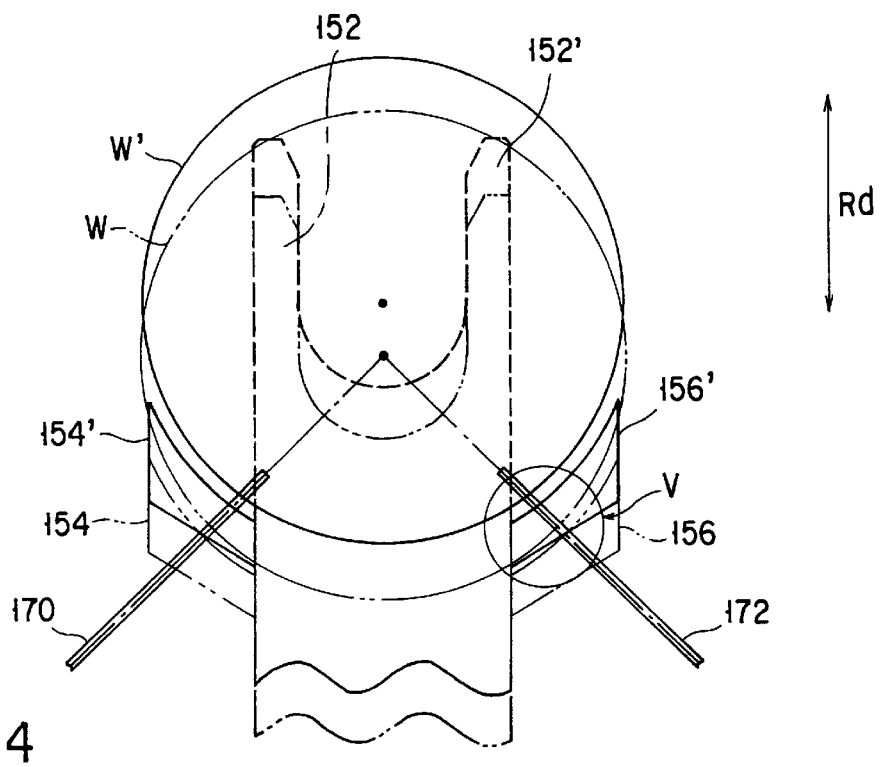
FIG. 4 is an illustration of a case where the amount of positional shift of a wafer is detected during an expanding/contracting operation of a transfer arm in the transfer apparatus shown in FIG. 1.

FIG. 4 is an illustration of a case where the amount of positional shift of a wafer is detected during an expanding/contracting operation of the transfer arm in the transfer apparatus shown in FIG. 1. In this case, the amount of positional shift of the wafer can be detected even though there is no specific relationship between the pick arm member 152 of the transfer arm and the detection ranges 170 and 172 (positions of the line sensors), as will be described below. In FIG. 4, alternate long and short dashed lines indicate the wafer W, pick arm member 152 and wings 154 and 156 when the pick arm member is located at the first position, and the solid line indicates the wafer W', pick arm member 152' and wings 154' and 156' when the pick arm member is located at the second position. In FIG. 4, the wafer is placed at the normal position.

Figure 5:
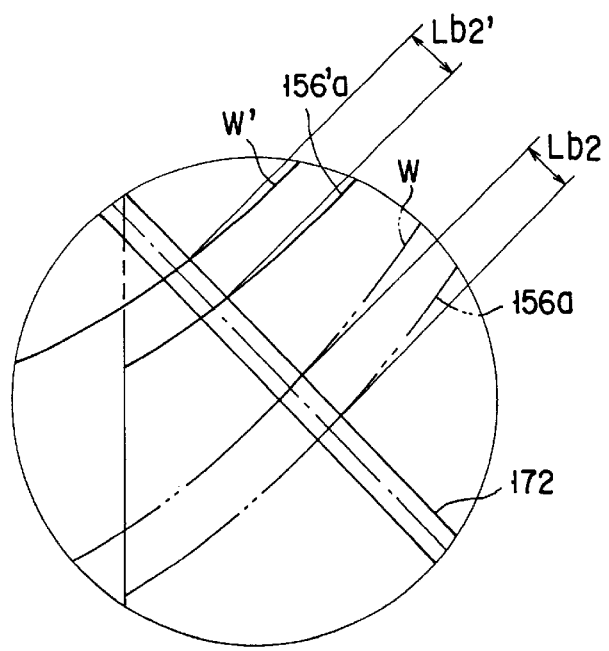
FIG. 5 is an enlarged view of a section V in FIG. 4.

FIG. 5 is an enlarged view of a section V in FIG. 4. In FIG. 5, Lb2 and Lb2' represent distances between the wafer and the wing within the detection range 172 in the first and second positions of the pick arm member. Since the wing is formed such that the curvature of the outer circumference of the wafer and that of the edge of the wing become equal to each other, Lb2 and Lb2' are equal to each other. When a displaced wafer is placed, the amount of positional shift of the wafer can be detected in either of the first and second positions.

According to the conventional method, the amount of positional shift of a wafer is detected only by the output of an optical sensor located at a specific position. The amount of positional shift cannot be detected unless a pick arm member (i.e., a wafer) is located at a predetermined position.

In the present embodiment, however, the amount of positional shift of a wafer is detected by detecting a distance between the wafer and a wing section that is a reference symbol for detecting the positional shift. Therefore, so long as a portion of the wafer to be detected, which faces the wing, and a portion of the wing to be detected, which faces the wafer, fall within the detection ranges 170 and 172, the amount of positional shift can be detected even though the pick arm member 152 is located at an arbitrary position within the detection ranges 170 and 172. Furthermore, the amount of positional shift can be detected even though the transfer arm 150 does not stop (while the wafer is moving).

Figure 6:
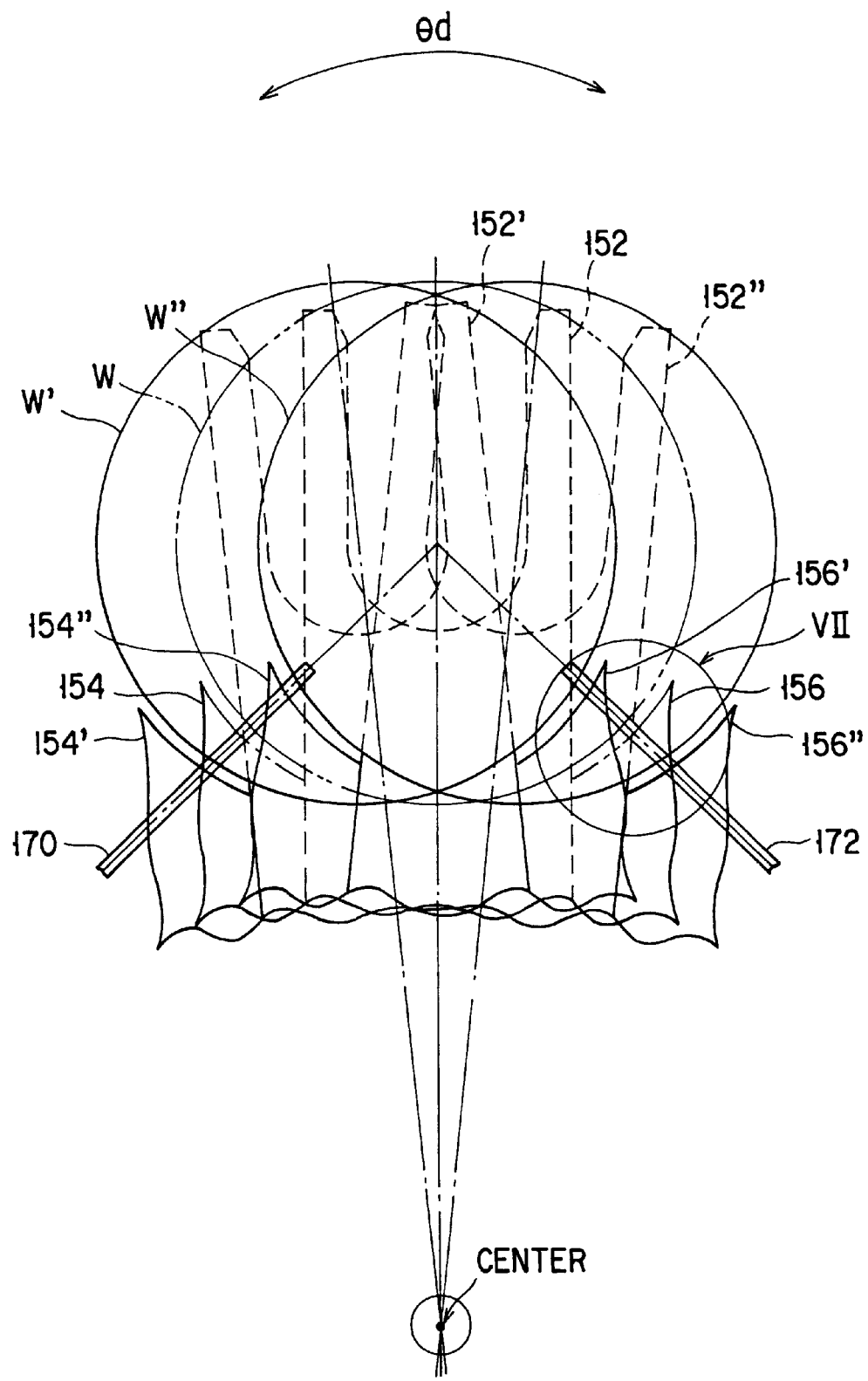
FIG. 6 is an illustration of a case where the amount of positional shift of a wafer is detected during a rotating operation of the transfer arm in the transfer apparatus shown in FIG. 1.

FIG. 6 is an illustration of a case where the amount of positional shift of a wafer is detected during a rotating operation of the transfer arm in the transfer apparatus shown in FIG. 1. In this case, too, the amount of positional shift of the wafer can be detected even though there is no specific relationship between the pick arm member 152 of the transfer arm and the detection ranges 170 and 172 (positions of the line sensors), as will be described below. FIG. 6 shows the wafer W, pick arm member 152 and wings 154 and 156 when the pick arm member is located at the first position, the wafer W', pick arm member 152' and wings 154' and 156' when the pick arm member is located at the second position, and the wafer W", pick arm member 152" and wings 154" and 156" when the pick arm member is located at the third position. In FIG. 6, the wafer is placed at the normal position.

Figure 7:
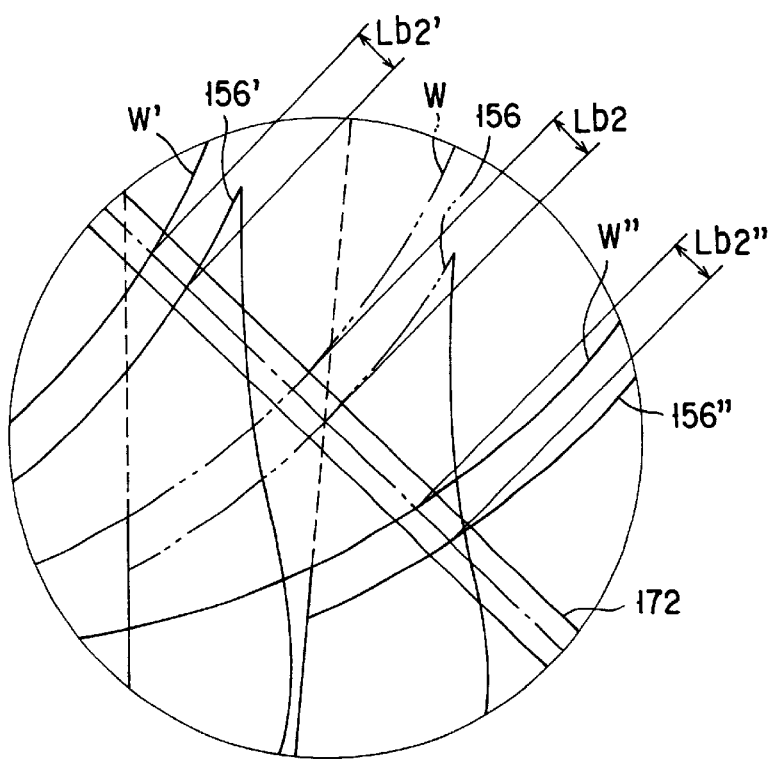
FIG. 7 is an enlarged view of a section VII in FIG. 6.

FIG. 7 is an enlarged view of a section VII in FIG. 6. In FIG. 7, Lb2, Lb2' and Lb2" represent distances between the wing and the wafer within the detection range 172 in the first, second and third positions of the pick arm member. Since the wing is formed such that the curvature of the outer circumference of the wafer and that of the edge of the wing become equal to each other, Lb2, Lb2' and Lb2" are substantially equal to each other. When a displaced wafer is placed, the amount of positional shift of the wafer can be detected in any of the first to third positions. As in the cases of FIGS. 4 and 5, the amount of positional shift can be detected even during the rotating operation if the pick arm member is located at an arbitrary position of the detection ranges 170 and 172.

Figure 8:
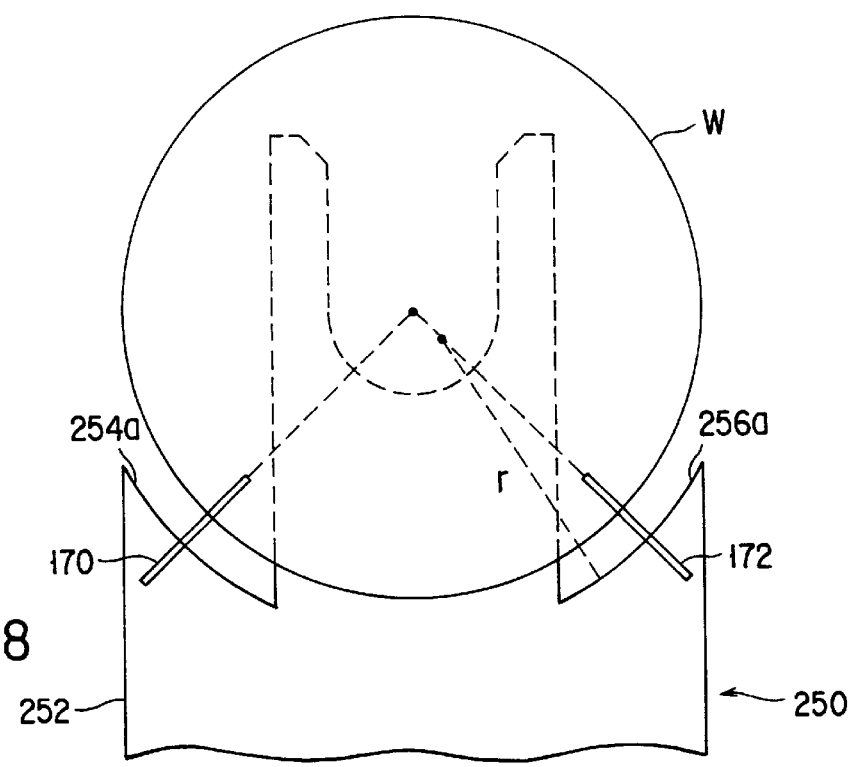
FIG. 8 is a plan view showing a relationship between the distal end portion of a pick arm member, a wafer placed thereon, and the detection ranges of line sensors in a transfer apparatus according to another embodiment of the present invention.

FIG. 8 is a plan view showing a relationship between the distal end portion of a pick arm member, a wafer placed thereon, and the detection ranges of line sensors in a transfer apparatus according to another embodiment of the present invention. In this embodiment, the pick arm member 252 of the transfer arm 250 has a proximal end portion that is broader than the distal end portion on which the wafer W is placed. Reference symbols for detecting the amount of positional shift of the wafer W are constituted of edges 254a and 256a of two arc-shaped step portions between the distal and proximal end portions of the pick arm member 252. The edges 254a and 256a have substantially the same curvature as that of the outer circumference of the wafer W like the edges 154a and 156a of the wings 154 and 156.

Figure 9:
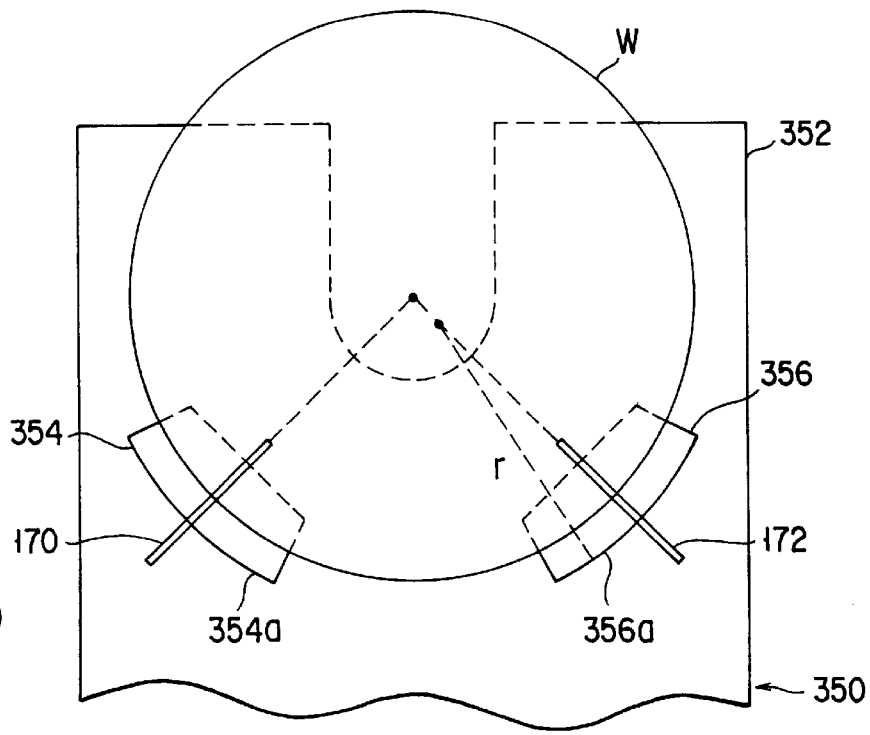
FIG. 9 is a plan view showing a relationship between the distal end portion of a pick arm member, a wafer placed thereon, and the detection ranges of line sensors in a transfer apparatus according to still another embodiment of the present invention.

FIG. 9 is a plan view showing a relationship between the distal end portion of a pick arm member, a wafer placed thereon, and the detection ranges of line sensors in a transfer apparatus according to still another embodiment of the present invention. In this embodiment, the whole of the pick arm member 352 of the transfer arm 350 is formed broader than the pick arm member 152 illustrated in FIG. 2. The pick arm member 352 has notched portions 354 and 356 corresponding to part of the outer circumference of the wafer W. Reference symbols for detecting the amount of positional shift of the wafer W are constituted of edges 354a and 356a defining one side of each of the notched portions 354 and 356. The edges 354a and 356a have substantially the same curvature as that of the outer circumference of the wafer W like the edges 154a and 156a of the wings 154 and 156.

Figure 10:
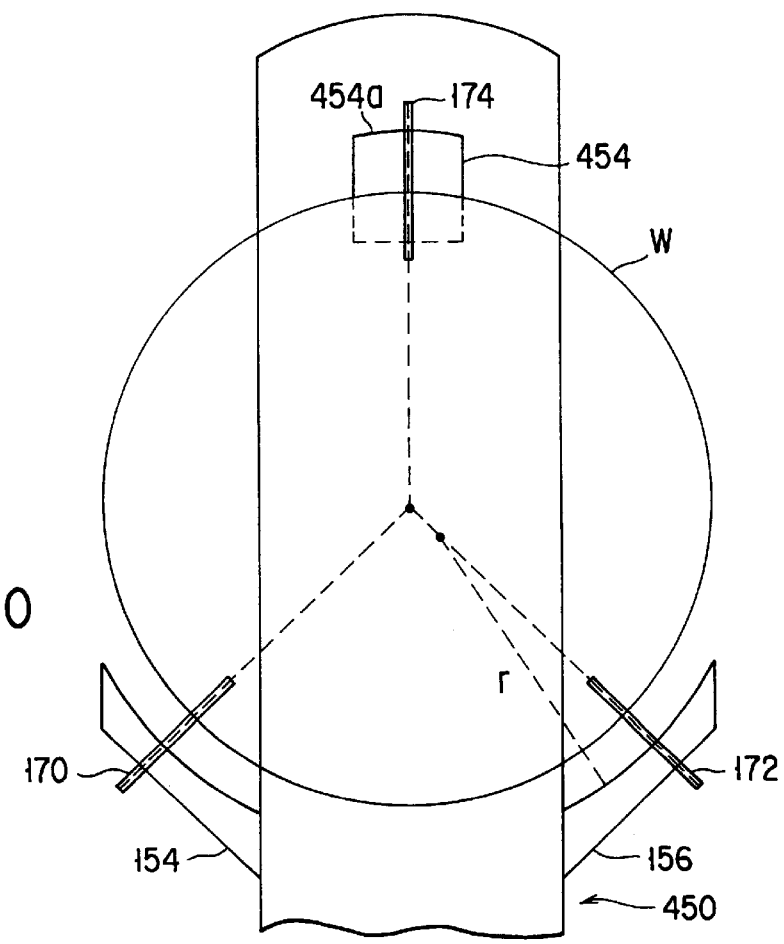
FIG. 10 is a plan view showing a relationship between the distal end portion of a pick arm member, a wafer placed thereon, and the detection ranges of line sensors in a transfer apparatus according to yet another embodiment of the present invention.

FIG. 10 is a plan view showing a relationship between the distal end portion of a pick arm member, a wafer placed thereon, and the detection ranges of line sensors in a transfer apparatus according to yet another embodiment of the present invention. This embodiment includes a third line sensor detection range 174 on the distal end side of the pick arm member 452 of the transfer arm 450, in addition to the first and second line sensor detection ranges 170 and 172. The third detection range 174 is formed by a line sensor having the same structure as that of the line sensors 162 and 164 of the first and second detection ranges 170 and 172. The third detection range 174 is located on an extension of a bisector of the interior angle of 90° formed by the first and second detection ranges 170 and 172 or along the expanding/contracting direction Rd of the transfer arm.

A notched portion 454 is formed at the distal end portion of the pick arm member 452 and corresponds to part of the outer circumference of the wafer W. An edge 454a defining one side of the notched portion 454 serves as a third reference symbol for detecting the amount of positional shift of the wafer W. The edge 454a has substantially the same curvature as that of the outer circumference of the wafer W. In this case, a value representing a distance between the wafer W located at the normal position and the edge 454a is stored in advance in the memory 106 of the CPU 105. In the CPU 105, the value is used for calculating the amount of positional shift of the wafer W to be actually transferred based on the distances Lm1 and Lm2 and the distance obtained from the third detection range 174.

According to the embodiment illustrated in FIG. 10, positional information of three points can be acquired and thus the radius of the wafer can be calculated in addition to the amount of positional shift of the wafer. Even when the wafer is thermally expanded due to an etching or deposition process, or a manufacturing error of the outside diameter of the wafer is large, the amount of positional shift can be detected correctly.

Figure 11:
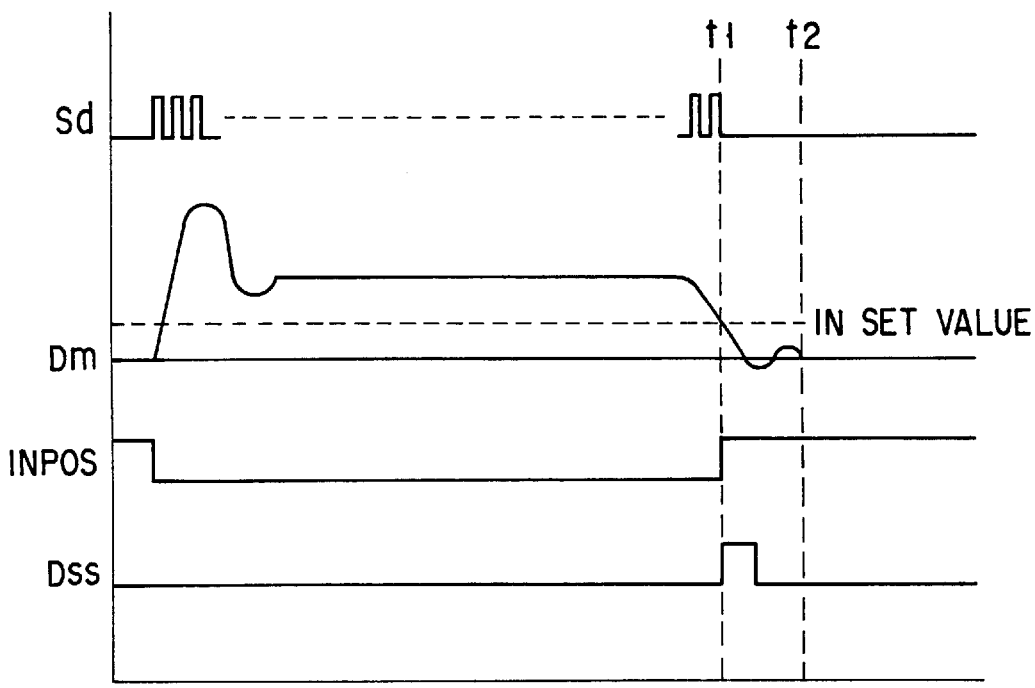
FIG. 11 is a timing chart of timing at which the amount of positional shift of a wafer is detected in the transfer apparatus illustrated in FIG. 1.

According to the present invention, the amount of positional shift can be detected even when the pick arm member of the transfer arm does not stop in a given position, as described above. Next a method for detecting the amount of positional shift of a wafer, which increases in throughput making the best use of such a feature, will be described. FIG. 11 is a timing chart of timing at which the amount of positional shift of a wafer is detected in the transfer apparatus illustrated in FIG. 1. In FIG. 11, Sd, Dm, INPOS and Dss indicate a driving signal of the transfer arm, the amount of operating deviation, an in-position signal and a detecting operation signal, respectively.

The transfer arm 150 performs a transferring operation of the wafer W upon receipt of pulsed driving signal Sd from the CPU 105. In actuality, however, a delay occurs between the driving signal and the operation of the transfer arm 150. The delay is represented by the amount of operating deviation Dm. If, at time t1, an output of the driving signal is stopped and a positional shift of the deviation amount becomes not larger than a predetermined IN SET VALUE, the in-position signal INPOS notifying that the transfer arm 150 falls within a given range is set at a high level. However, it is time t2 after a lapse of a predetermined period of time since the in-position signal INPOS becomes high in level, when the transfer arm 150 stops operating and its positioning is completed. The interval between t1 and t2 is approximately 0.2 to 0.5 seconds depending upon the gain adjustment of a motor.

According to the present embodiments of the present invention, the distances Lm1 and Lm2 are measured immediately before the transfer arm 150 stops at a standby position, to detect the amount of positional shift of the wafer W. In other words, when the in-position signal INPOS is set at a high level (becomes effective), a pulse is generated in the detecting operation signal Dss and the detection of the amount of positional shift is started. When the in-position signal INPOS is set at a high level, the outer circumference of the wafer W and the edge of the wing fall within the detection ranges 170 and 172, so that the amount of positional shift can be detected by the foregoing method.

The detection of the amount of positional shift is performed several times from the viewpoint of the prevention of noise. The values thus detected at the several times are then subjected to an arithmetic operation, thereby obtaining the amount of positional shift. It takes 0.1 to 0.2 seconds to perform all detections of the amount of positional shift, though the time varies with the number of detections. For example, when the number of detections is five, the wafer does not stop completely, so that the detections are performed in slightly different five positions in the moving direction of the wafer. Since the amount of positional shift is detected when the wafer does not stop completely, throughput can be improved by about 0.1 to 0.4 seconds faster than when the amount of positional shift is detected after the wafer stops completely. In other words, the transfer operation can proceed to the next one immediately after the wafer stops completely.

Calculating the amount of positional shift of the wafer, the CPU 105 controls the transfer arm 150 by the driving section 148 such that the wafer is transferred to the normal position of the destination. For example, when the wafer W is transferred from the standby position to the center of the worktable S of the process chamber 142, the CPU 105 considers the calculated amount of positional shift of the wafer W and controls the driving section 148 such that the transfer arm 150 performs correction for the amount of positional shift. The transfer arm 150 that makes the R-θ movement (expanding/contracting direction Rd-rotating direction θd) transfers the wafer W while performing correction for the calculated amounts of positional shift ΔR and Δθ by the known method.

In FIG. 1, the detection ranges 170 and 172 are set only in the standby positions of the wafer W in the process chamber 142; however, they can be set in the standby positions of the other process chambers 140, 144 and 146. Generally, the wafer W is displaced when it is transferred by the transfer arm and when it is carried in/out of the process chambers. The amount of positional shift is likely to be accumulated in a specific direction at worst. It is therefore the most effective in reducing the amount of positional shift of the wafer W to arrange the line sensors in the standby positions of the process chambers 140, 142, 144 and 146 and correct the amount of positional shift whenever the wafer W is carried in/out of each of the process chambers.

To arrange the line sensors in the respective process chambers, however, increases a space and a cost. At the design stage of the semiconductor processing system, therefore, all the standby positions of the process chambers 140, 142, 144 and 146 are designed such that they can be provided with the line sensors. At the actual processing stage, the line sensors are disposed in required positions in accordance with processing conditions such as the transfer order of the wafer W.

The line sensors can be fixed in given positions to detect the amount of positional shift of the wafer W on predetermined conditions based on a relationship between the setting position of line sensors and the transfer order of the wafer W. TABLE 1 shows a relationship between the presence and absence of the line sensor located at the standby position and the operation of detecting the amount of positional shift.

TABLE 1

| Originator | Presence/ absence of sensor | Destination | Presence/ absence of sensor | Detection of amount of positional shift |
|---|---|---|---|---|
| Process chamber | Absence | Process chamber | Absence | No detection |
| Process chamber | Absence | Process chamber | Presence | Detection in standby position of destination |
| Process chamber | Presence | Process chamber | Absence | Detection in standby position of originator |
| Process chamber | Presence | Process chamber | Presence | Detection in standby position of destination |
| Orienter | — | Process chamber | Presence | No detection |

In TABLE 1, when a wafer W is transferred from one process chamber (or orienter) to another process chamber, the former chamber (orienter) is referred to as "originator" and the latter chamber is referred to as "destination." According to the example of TABLE 1, the amount of positional shift is detected by prioritizing a line sensor of the "destination." When the wafer W is transferred from the orienter 160 to another process chamber, the detection of the amount of positional shift of the wafer is not performed after the transfer, because the orienter 160 can perform positioning with a high accuracy.

According to the transfer apparatus of the present embodiment described above, the reference symbols are provided movably together with the mount portion of the transfer arm and the amount of positional shift of the wafer is detected as coordinates with reference to the transfer arm. Even though the transfer arm does not stop in a given position, the amount of positional shift can be detected.

According to the foregoing embodiments, a distance between the wafer and the reference symbol is measured by the optical sensor. However, another type of sensor such as an ultrasound sensor can be employed. The transfer arm shown in FIG. 1 is of a type for transferring a wafer by expanding/contracting and rotating operations. However, a transfer arm that makes a linear movement and an X-Y movement can be used in the present invention.

In the above-described embodiments, the transfer apparatus is provided in a common transfer chamber of a cluster tool type vacuum processing system having a single wafer processing apparatus for oxidation, diffusion, deposition, etching, annealing and the like. However, the present invention can generally be applied to a transfer apparatus provided inside and outside a transfer chamber in various semiconductor processing systems. Furthermore, the present invention can be applied to a target substrate other than a semiconductor wafer, e.g., an LCD substrate and a glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A transfer apparatus for transferring a target substrate in a semiconductor processing system, comprising:

a transfer member including a mount portion on which the substrate is placed;

a driving section configured to drive the transfer member in order to transfer the substrate;

first and second reference portions provided adjacent to the mount portion, the first and second reference portions moving integratedly with the mount portion when the transfer member transfers the substrate;

a storage section configured to store first and second reference values representing distances between the substrate located at a normal position on the mount portion and the first and second reference portions;

a detecting section configured to detect first and second distances between the substrate and the first and second reference portions when the transfer member transfers the substrate; and a calculating section configured to calculate the amount of positional shift of the substrate from the normal position based on the first and second reference values and the first and second distances.

2. The apparatus according to claim 1, wherein the detecting section includes first and second detection ranges extending along directions defining the first and second distances.

3. The apparatus according to claim 2, wherein the detecting section comprises first and second optical sensors arranged to correspond to the first and second detection ranges.

4. The apparatus according to claim 2, wherein the first and second detection ranges form an interior angle, and the transfer member transfers the substrate in the normal position along a direction of a bisector of the interior angle.

5. The apparatus according to claim 4, wherein the interior angle is 90°.

6. The apparatus according to claim 4, wherein the bisector passes a center of the substrate located at the normal position.

7. The apparatus according to claim 1, wherein the substrate is circular, and the first and second reference portions each include a edge having a curvature which is equal to that of an outer circumference of the substrate.

8. The apparatus according to claim 1, wherein the first and second reference portions are arranged symmetrically with regard to a central axis of the mount portion.

9. The apparatus according to claim 1, wherein the first and second reference portions comprise extending portions that extend from both sides of the transfer member.

10. The apparatus according to claim 1, wherein the first and second reference portions comprise notched portions formed in the transfer member.

11. The apparatus according to claim 1, wherein the apparatus further comprises a third reference portion provided adjacent to the mount portion, the third reference portion moving integratedly with the mount portion when the transfer member transfers the substrate;
   the storage section further stores a third reference value representing a distance between the substrate located at the normal position on the mount portion and the third reference portion;
   the detecting section further detects a third distance between the substrate and the third reference portion when the transfer member transfers the substrate; and
   the calculating section calculates the amount of positional shift of the substrate from the normal position based on the first to third reference values and the first to third distances.

12. The apparatus according to claim 1, further comprising a control section configured to control the driving section in consideration of the amount of positional shift of the substrate calculated by the calculating section when the transfer member transfers the substrate.

13. The apparatus according to claim 1, wherein the detecting section detects the first and second distances immediately before the transfer member transferring the substrate stops at a stop position.

14. The apparatus according to claim 13, wherein the detecting section starts to detect the first and second distances when the amount of deviation becomes not larger than a predetermined value, the amount of deviation representing a delay in an operation of the transfer member driven by the driving section in response to a driving signal supplied from the control section to the driving section.

15. A transfer apparatus for transferring a target substrate in a semiconductor processing system, the semiconductor processing system including an airtight process chamber for processing the substrate and an airtight transfer chamber connected to the process chamber through a gate, the transfer apparatus comprising:
   a transfer member provided in the transfer chamber in order to transfer the substrate between the transfer chamber and the process chamber, the transfer member including a mount portion on which the substrate is placed;
   a driving section configured to drive the transfer member in order to transfer the substrate;
   first and second reference portions which are visible optically and provided adjacent to the mount portion, the first and second reference portions moving integratedly with the mount portion when the transfer member transfers the substrate;
   a storage section configured to store first and second reference values representing distances between the substrate located at a normal position on the mount portion and the first and second reference portions;
   a detecting section for optically detecting first and second distances between the substrate and the first and second reference portions when the transfer member transfers the substrate;
   a calculating section configured to calculate the amount of positional shift of the substrate from the normal position based on the first and second reference values and the first and second distances; and
   a control section configured to control the driving section in consideration of the amount of positional shift of the substrate calculated by the calculating section when the transfer member transfers the substrate to the process chamber.

16. The apparatus according to claim 15, wherein a standby position in which the transfer member stops is set in the transfer chamber in front of the process chamber, and the control section controls the driving section in consideration of the amount of positional shift of the substrate calculated by the calculating section when the transfer member transfers the substrate from the standby position to the process chamber.

17. The apparatus according to claim 16, wherein the detecting section detects the first and second distances immediately before the transfer member transferring the substrate stops in the standby position.

18. The apparatus according to claim 15, wherein the detecting section includes first and second detection ranges extending along directions defining the first and second distances, and each of the first and second detection ranges is defined by a light-emitting device and a light-receiving device disposed one on either of a ceiling and a floor of the transfer chamber.

19. A method of transferring a target substrate in a semiconductor processing system, comprising the steps of:
   preparing a transfer apparatus, wherein the transfer apparatus comprises a transfer member including a mount portion on which the substrate is placed, a driving section configured to drive the transfer member in order to transfer the substrate, and first and second reference portions provided adjacent to the mount portion, the first and second reference portions moving integratedly with the mount portion when the transfer member transfers the substrate;
   storing first and second reference values representing distances between the substrate located at a normal position on the mount portion and the first and second reference portions;
   detecting first and second distances between the substrate and the first and second reference portions when the transfer member transfers the substrate;
   calculating the amount of positional shift of the substrate from the normal position based on the first and second reference values and the first and second distances; and
   controlling the driving section such that the transfer member transfers the substrate in consideration of the calculated amount of positional shift of the substrate.

* * * * *